(12) United States Patent
Ogawa et al.

(10) Patent No.: US 8,258,582 B2
(45) Date of Patent: *Sep. 4, 2012

(54) SEMICONDUCTOR DEVICE AND METHOD FOR MANUFACTURING THE SAME

(75) Inventors: Hisashi Ogawa, Osaka (JP); Yoshihiro Mori, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/182,993

(22) Filed: Jul. 14, 2011

(65) Prior Publication Data

US 2011/0266629 A1 Nov. 3, 2011

Related U.S. Application Data

(62) Division of application No. 12/473,710, filed on May 28, 2009, now Pat. No. 8,004,044.

(30) Foreign Application Priority Data

Jun. 12, 2008 (JP) ................................ 2008-154532

(51) Int. Cl.
*H01L 29/76* (2006.01)
*H01L 29/94* (2006.01)

(52) U.S. Cl. .......................... 257/369; 257/392; 438/591

(58) Field of Classification Search .................. 257/369, 257/392, E27.06, E27.062, E21.192; 438/591
See application file for complete search history.

(56) References Cited

U.S. PATENT DOCUMENTS

| 8,004,044 B2* | 8/2011 | Ogawa et al. ................. 257/369 |
| 2007/0138563 A1 | 6/2007 | Callegari et al. |
| 2007/0210354 A1 | 9/2007 | Nabatame et al. |
| 2008/0050870 A1 | 2/2008 | Yamamoto |
| 2008/0135944 A1 | 6/2008 | Ichihara et al. |
| 2008/0197421 A1 | 8/2008 | Mitsuhashi et al. |
| 2008/0220603 A1 | 9/2008 | Fukushima et al. |
| 2009/0039437 A1* | 2/2009 | Ogawa ........................... 257/369 |
| 2009/0134466 A1 | 5/2009 | Cho et al. |
| 2009/0146215 A1 | 6/2009 | Ogawa |
| 2009/0212371 A1* | 8/2009 | Kobayashi ..................... 257/369 |
| 2009/0218634 A1 | 9/2009 | Sakashita et al. |

FOREIGN PATENT DOCUMENTS

JP 2006-108439 4/2006

(Continued)

OTHER PUBLICATIONS

United States Notice of Allowance issued in U.S. Appl. No. 12/473,710, mailed Apr. 14, 2011.

(Continued)

*Primary Examiner* — Theresa T Doan
(74) *Attorney, Agent, or Firm* — McDermott Will & Emery LLP

(57) ABSTRACT

A semiconductor device including a first transistor of a first conductivity type provided on a first active region of a semiconductor region, and a second transistor of a second conductivity type provided on a second active region of the semiconductor region. The first transistor includes a first gate insulating film and a first gate electrode, the first gate insulating film contains a high-k material and a first metal, and the first gate electrode includes a lower conductive film, a first conductive film and a first silicon film. The second transistor includes a second gate insulating film and a second gate electrode, the second gate insulating film contains a high-k material and a second metal, and the second gate electrode includes a second conductive film made of the same material as the first conductive film, and a second silicon film.

21 Claims, 7 Drawing Sheets

FOREIGN PATENT DOCUMENTS

| | | |
|---|---|---|
| JP | 2007-165872 | 6/2007 |
| JP | 2007-243009 | 9/2007 |
| JP | 2008-053283 | 3/2008 |
| JP | 2009-111380 | 5/2009 |
| JP | 2009-141168 | 6/2009 |
| JP | 2009-194352 | 8/2009 |
| JP | 2009-267342 | 11/2009 |

OTHER PUBLICATIONS

S.C. Song, et al., "Highly Manufacturable 45 nm LSTP CMOSFETs Using Novel Dual High-k and Dual Metal Gate CMOS Intergration," VLSI, 2006, p. 16-17.

Japanese Notice of Reasons for Rejection, w/ English translation thereof, issued in Japanese Patent Application No. JP 2008-154532 dated May 18, 2010.

* cited by examiner

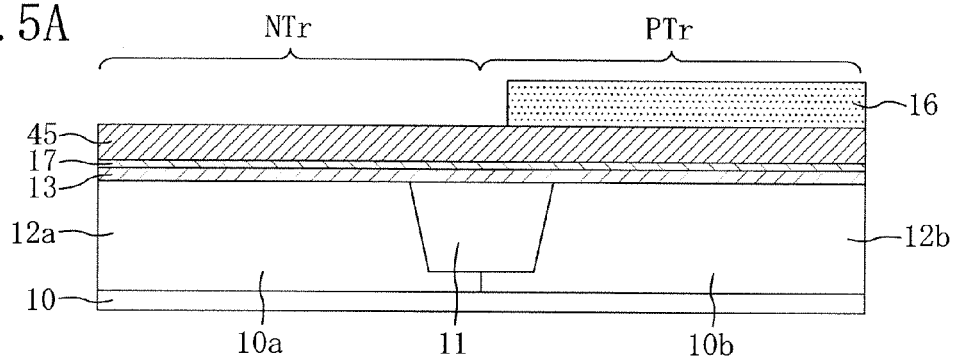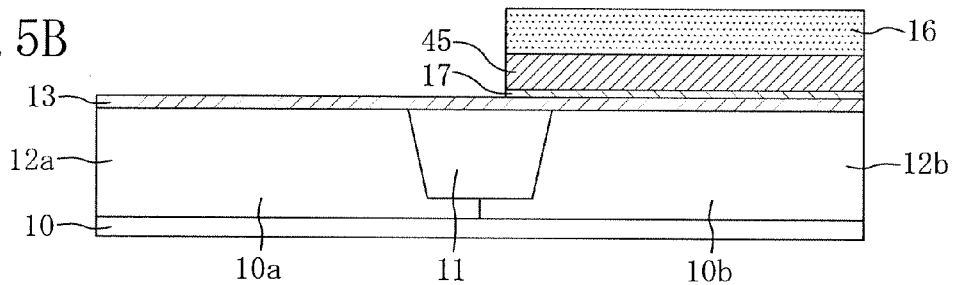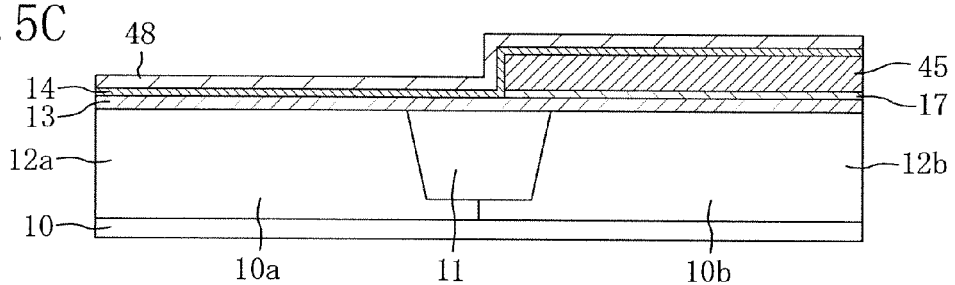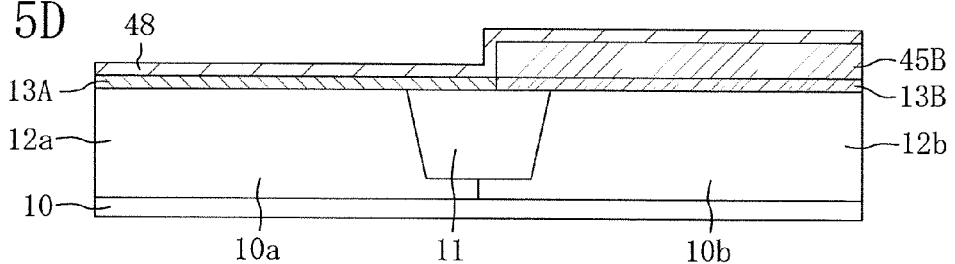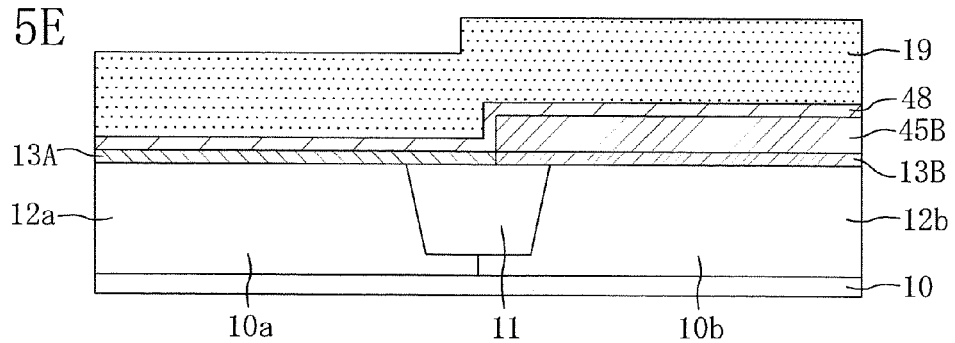

SEMICONDUCTOR DEVICE AND METHOD FOR MANUFACTURING THE SAME

CROSS REFERENCE TO RELATED APPLICATION

This application is a Divisional of U.S. application No. 12/473,710, filed on May 28, 2009, now U.S. Pat No. 8,004,044, which claims priority under 35 U.S.C. §119 on U.S. patent application Ser. No. 2008-154532 filed in Japan on Jun. 12, 2008, the entire contents of each of which are hereby incorporated by reference.

BACKGROUND OF THE INVENTION

The present disclosure relates to a semiconductor device and a method for manufacturing the same. More particularly, the present disclosure relates to a semiconductor device including a MISFET (Metal-insulator semiconductor field-effect transistor) having a gate insulating film including a high-k material and a gate electrode including a metal film (hereinafter referred to as a "metal gate electrode").

There are demands for further miniaturizing CMOS (Complementary metal-oxide semiconductor) devices. Further miniaturization of CMOS devices requires a reduction in the thickness of a gate insulating film. However, a further reduction in the thickness of a conventional gate insulating film which is a silicon oxide film may result in an increase in the leak current, thereby increasing the standby current of an LSI (Large scale integration). Thus, the approach of reducing the thickness of the gate insulating film which is a silicon oxide film has reached its limits. Public attention has been drawn to CMIS (Complementary metal-insulator semiconductor) devices in which an insulating film of a high-k material, instead of a silicon oxide film, is used as the gate insulating film. The electrical thickness of an insulating film made of a high-k material can be made small even if the physical thickness thereof is large, and it is expected with such an insulating film that the thickness of the gate insulating film can be further reduced. The high-k material of a gate insulating film that is currently considered most promising is nitrided hafnium silicate (HfSiON).

Also with the gate electrode, the depletion of a conventional polysilicon electrode has become non-negligible, and metal gate electrodes free from depletion have been researched and developed actively.

On the other hand, properties required of the gate insulating film and the gate electrode are different between N-type MISFETs and P-type MISFETs. Specifically, it is preferred that the effective work function is low in an N-type MISFET and that it is high in a P-type MISFET. Thus, there has been proposed a process for forming N-type MISFETs and P-type MISFETs having gate insulating films and gate electrodes of different properties from each other (see, for example, S. C. Song, et al., "Highly Manufacturable 45 nm LSTP CMOS-FETs Using Novel Dual High-k and Dual Metal Gate CMOS Integration", VLSI, 2006, p. 16-17).

Referring now to FIGS. 6A to 6D and 7A to 7B, a conventional method for manufacturing a semiconductor device will be described. In the figures, "NTr" on the left denotes an N-type MISFET formation region Ntr where an N-type MISFET is formed, and "PTr" on the right denotes a P-type MISFET formation region PTr where a P-type MISFET is formed.

First, as shown in FIG. 6A, a device isolation region 111 is formed in an upper portion of a semiconductor substrate 110, thereby forming a first active region 110a in the N-type MISFET formation region Ntr of the semiconductor substrate 110 and a second active region 110b in the P-type MISFET formation region PTr thereof. Then, a p-type well region 112a is formed in the N-type MISFET formation region Ntr of the semiconductor substrate 110, and an n-type well region 112b is formed in the P-type MISFET formation region PTr thereof. Then, a first insulating film 113 and a first conductive film 114 are formed in this order across the entire upper surface of the semiconductor substrate 110, and an amorphous silicon film 115 covering a portion of the first conductive film 114 that is formed over the first active region 110a is formed selectively.

Then, as shown in FIG. 6B, a portion of the first insulating film 113 and the first conductive film 114 that is formed over the second active region 110b is removed using the amorphous silicon film 115 as a mask. Then, a second insulating film 116 and a second conductive film 117 are formed in this order on a portion of the upper surface of the semiconductor substrate 110 that is not covered by the first insulating film 113 and on the amorphous silicon film 115, and an amorphous silicon film 118 covering a portion of the second conductive film 117 that is formed over the second active region 110b is formed selectively.

Then, as shown in FIG. 6C, a portion of the second insulating film 116 and the second conductive film 117 that is formed over the first active region 110a is removed using the amorphous silicon film 118 as a mask.

Then, as shown in FIG. 6D, after the amorphous silicon films 115 and 118 are removed, a polysilicon film 120 is formed on the first conductive film 114, on the second conductive film 117, and on a portion of the upper surface of the semiconductor substrate 110 that is not covered by the first insulating film 113 or the second insulating film 116.

Then, as shown in FIG. 7A, the first conductive film 114, the second conductive film 117 and the polysilicon film 120 are removed selectively. As a result, a first gate electrode 200 including the first conductive film 114 and the polysilicon film 120 is formed over the first active region 110a, and a second gate electrode 201 including the second conductive film 117 and the polysilicon film 120 is formed over the second active region 110b.

Then, as shown in FIG. 7B, the first insulating film 113 and the second insulating film 116 are removed selectively. As a result, the first gate electrode 200 is formed over the first active region 110a, with a first gate insulating film which is the first insulating film 113 interposed therebetween, and the second gate electrode 201 is formed over the second active region 110b, with a second gate insulating film which is the second insulating film 116 interposed therebetween. A conventional semiconductor device can be produced as described above.

Herein, it is possible to optimize the properties of the N-type MISFET and those of the P-type MISFET by using an HfSiON film for the first insulating film 113, a TiN film for the first conductive film 114, an $HfO_2$ film for the second insulating film 116, and a TaN film for the second conductive film 117.

SUMMARY OF THE INVENTION

With the conventional method for manufacturing a semiconductor device, if an HF solution is used for selectively removing the second insulating film ($HfO_2$ film) 116 in the step shown in FIG. 6C, since the device isolation region (NSG (non-doped silicate glass) film) 111 has a higher etching rate for an HF solution than the first insulating film (HfSiON film) 113 and the second insulating film ($HfO_2$ film) 116, an undercut portion 119 is formed in a portion of the device isolation region (NSG film) 111 under the edge of the first insulating film (HfSiON film) 113 and the second insulating film (HfO$_2$ film) 116 as shown in FIG. 6C.

When the polysilicon film (P-doped PolySi film) 120 is formed over the semiconductor substrate 110 in a subsequent step, the polysilicon film 120 is formed so as to fill the undercut portion 119 as shown in FIG. 6D. Then, even by performing an etching process for forming the first gate electrode 200 and the second gate electrode 201 (FIG. 7A) or by selectively removing the first insulating film 113 and the second insulating film 116 so as to form a first gate insulating film and a second gate insulating film (FIG. 7B), it is not possible to remove polysilicon in the undercut portion 119. A polysilicon residual portion 121 in the undercut portion 119 causes gate line shorting, and the like, thereby resulting in a defect of the semiconductor device.

A semiconductor device including: a first transistor of a first conductivity type provided on a first active region of a semiconductor region; and a second transistor of a second conductivity type provided on a second active region of the semiconductor region, wherein the second active region is separated from the first active region by a device isolation region. The first transistor includes a first gate insulating film formed on the first active region and containing a high-k material and a first metal, and a first gate electrode including a lower conductive film formed on the first gate insulating film, a first conductive film formed on the lower conductive film, and a first silicon film formed on the first conductive film. The second transistor includes a second gate insulating film formed on the second active region and containing the high-k material and a second metal, and a second gate electrode including a second conductive film formed on the second gate insulating film and made of the same material as the first conductive film, and a second silicon film formed on the second conductive film.

With the above configuration, the composition of the gate insulating film of the first transistor is different from that of the second transistor, and the composition of the gate electrode of the first transistor is different from that of the second transistor. Thus, the gate insulating film and the gate electrode of the first transistor have optimal properties for the first transistor, and those of the second transistor have optimal properties for the second transistor.

With the above configuration, the first gate insulating film and the second gate insulating film contain the same high-k material. Therefore, when such a semiconductor device is manufactured, it is possible to prevent the upper surface of the device isolation region from being exposed from the step in which the high-k film is formed on the semiconductor region until the step in which the gate electrode and the gate insulating film are formed. Therefore, such a semiconductor device is manufactured without an undercut portion being formed on the upper surface of the device isolation region, thus preventing a polysilicon residual from being left on the upper surface of the device isolation region.

In the semiconductor device of the present invention, it is preferred that the first gate insulating film does not contain the second metal, and the second gate insulating film does not contain the first metal. Thus, the gate insulating film and the gate electrode of the first transistor can have optimal properties for the first transistor, and those of the second transistor can have optimal properties for the second transistor.

In the semiconductor device of the present invention, it is preferred that a value of an effective work function of the first transistor is altered by the first metal, and a value of an effective work function of the second transistor is altered by the second metal.

In the semiconductor device of the present invention, it is preferred that a thickness of the first gate electrode is greater than that of the second gate electrode.

In the semiconductor device of the present invention, the lower conductive film may contain a conductive material and the second metal. Herein, it is preferred that the conductive material is tantalum nitride, titanium nitride, or tantalum carbide.

In the semiconductor device of the present invention, it is preferred that the first conductive film and the second conductive film are each made of titanium nitride, ruthenium or aluminum nitride-molybdenum.

In a first preferred embodiment to be described below, the first transistor is an N-type MIS transistor, and the second transistor is a P-type MIS transistor. In such a case, the first metal is at least one of a lanthanoid element, scandium, strontium and magnesium, and the second metal is at least one of aluminum and tantalum.

In a second preferred embodiment to be described below, the first transistor is a P-type MIS transistor, and the second transistor is an N-type MIS transistor. In such a case, the first metal is at least one of aluminum and tantalum, and the second metal is at least one of a lanthanoid element, scandium, strontium and magnesium.

In the semiconductor device of the present invention, it is preferred that the high-k material is an oxide, an oxynitride or a silicate containing at least one of hafnium, zirconium and yttrium.

In the semiconductor device of the present invention, it is preferred that the first gate insulating film includes a first base film made of a silicon oxynitride between the first active region and the high-k material in the first gate insulating film, and the second gate insulating film includes a second base film made of the silicon oxynitride between the second active region and the high-k material in the second gate insulating film.

A method for manufacturing a semiconductor device of the present invention is a method for manufacturing a semiconductor device including a first transistor provided on a first active region of a semiconductor region, and a second transistor provided on a second active region of the semiconductor region, wherein the second active region is separated from the first active region by a device isolation region. Specifically, the method for manufacturing a semiconductor device of the present invention includes the steps of: (a) forming a high-k film made of a high-k material on the first active region and the second active region; (b) forming a first material film containing a first metal and a lower conductive film in this order on a portion of the high-k film that is provided on the first active region; (c) forming a second material film containing a second metal on a portion of the high-k film that is provided on the second active region; (d) forming a conductive film on the lower conductive film and on the second material film; (e) forming a silicon film on the conductive film; (f) etching the silicon film, the conductive film, the lower conductive film and the high-k film; and (g) diffusing the first metal from the first material film into a portion of the high-k film that is provided on the first active region, and diffusing the second metal from the second material film into a portion of the high-k film that is provided on the second active region.

With the above manufacturing method, the composition of the gate insulating film of the first transistor can be made different from that of the second transistor, and the composition of the gate electrode of the first transistor can be made different from that of the second transistor. Thus, the gate insulating film and the gate electrode of the first transistor can have optimal properties for the first transistor, and those of the second transistor can have optimal properties for the second transistor.

With the above manufacturing method, a high-k film is formed on the first active region and on the second active region. Therefore, it is possible to prevent the upper surface of the device isolation region from being exposed from the step in which the high-k film is formed on the semiconductor region until the step in which the gate electrode and the gate insulating film are formed. Therefore, it is possible to prevent an undercut portion from being formed on the upper surface of the device isolation region, thus preventing a polysilicon residual from being left on the upper surface of the device isolation region.

In the method for manufacturing a semiconductor device of the present invention, it is preferred that the step (g) includes a step of diffusing the first metal and the second metal by a heat treatment, performed after the step (d) and before the step (e), and as a result of the etching in the step (f), a first gate electrode including the lower conductive film, the conductive film and the silicon film is formed on the first active region with a first gate insulating film containing the high-k material and the first metal interposed therebetween, and a second gate electrode including the conductive film and the silicon film is formed on the second active region with a second gate insulating film containing the high-k material and the second metal interposed therebetween.

In the method for manufacturing a semiconductor device of the present invention, the step (c) includes a step of forming the second material film on the lower conductive film, in the step (d), the conductive film is formed on the lower conductive film with the second material film interposed therebetween, and the step (g) includes a step of diffusing the second metal from the second material film into the lower conductive film.

BRIEF DESCRIPTION OF THE DRAWINGS

FIGS. 5A to 5E are cross-sectional views sequentially showing steps of a part of a method for manufacturing a semiconductor device of the second embodiment.

DETAILED DESCRIPTION OF THE PREFERRED EMBODIMENTS

Figure 1:
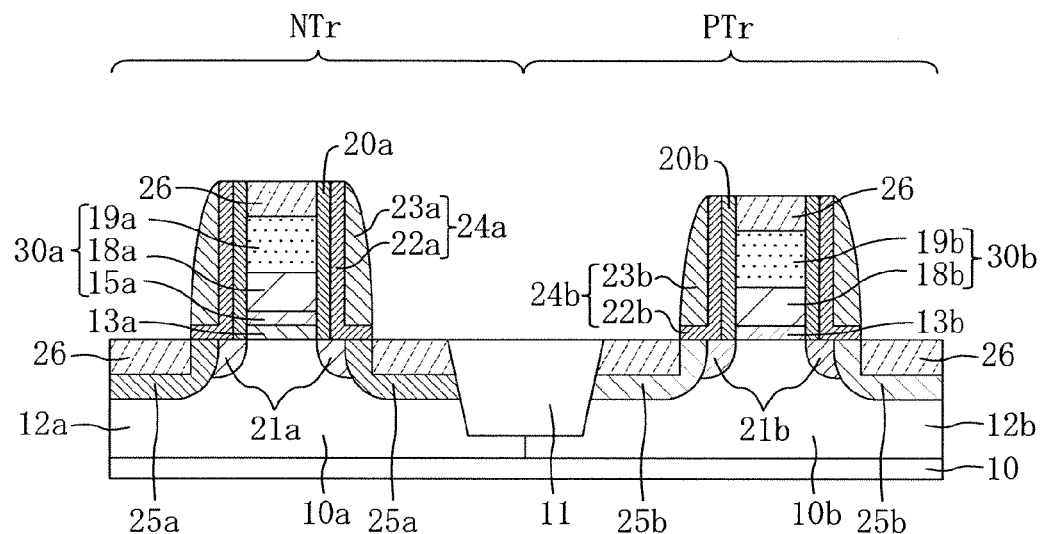
FIG. 1 is a cross-sectional view showing a semiconductor device of a first embodiment.

Example embodiments will now be described in detail with reference to the drawings. Note that the present invention is not limited to those embodiments illustrated herein. For example, specific values of thickness, concentration, etc., are not limited to those shown herein, and the film formation method, the etching method, etc., are also not limited to those shown herein. Herein, like elements may be denoted by like reference numerals and not described repeatedly.

In the following embodiments, in order to distinguish between elements of an N-type MISFET and those of a P-type MISFET, the elements of the N-type MISFET are prefixed with "first" and those of the P-type MISFET with "second" as a general rule. Note however that "a first transistor of a first conductivity type" as used in the claims refers to an "N-type MISFET" in the first embodiment but to a "P-type MISFET" in the second embodiment. Similarly, "a second transistor of a second conductivity" as used in the claims refers to a "P-type MISFET" in the first embodiment but to an "N-type MISFET" in the second embodiment.

First Embodiment

A semiconductor device of a first embodiment and a method for manufacturing the same will be described with reference to the drawings.

First, the structure of the semiconductor device of the first embodiment will be described with reference to FIG. 1. FIG. 1 shows a cross section of the semiconductor device of the first embodiment. In the figures, "NTr" on the left denotes an N-type MISFET formation region Ntr where an N-type MISFET is formed, and "PTr" on the right denotes a P-type MISFET formation region PTr where a P-type MISFET is formed.

As shown in FIG. 1, in an upper portion (semiconductor region) of a semiconductor substrate 10, a device isolation region 11 is formed by filling a trench with an insulating film so as to partition between a first active region 10a where a p-type well region 12a is formed and a second active region 10b where an n-type well region 12b is formed. The semiconductor device includes an N-type MISFET (N-type MIS transistor) provided over the first active region 10a of the N-type MISFET formation region Ntr, and a P-type MISFET (P-type MIS transistor) provided over the second active region 10b of the P-type MISFET formation region PTr.

The N-type MISFET includes a first gate insulating film 13a formed on the first active region 10a, a first gate electrode 30a formed on the first gate insulating film 13a, a first sidewall 24a formed on a side surface of the first gate electrode 30a with a first offset spacer 20a interposed therebetween (the first sidewall 24a includes a first inner sidewall 22a having an L-shaped cross section and a first outer sidewall 23a), an n-type extension region 21a of a relatively small junction depth formed in a portion of the first active region 10a that is below and beside the first gate electrode 30a, an n-type source/drain region 25a of a relatively large junction depth formed in a portion of the first active region 10a that is below and beside the first sidewall 24a, and a silicide layer 26 formed on the n-type source/drain region 25a and on the first gate electrode 30a.

The first gate insulating film 13a includes a first base film (not shown) made of a silicon oxynitride (SiON) and a first high-k film made of a nitrided hafnium silicate (HfSiON) containing lanthanum (La), which is the first metal, wherein these films are formed in this order starting from the bottom (from the side of the first active region 10a). The first high-k film is an insulating film having a relative dielectric constant that is greater than that of a silicon oxide film or a silicon oxynitride film, and is made of a high-k material having a relative dielectric constant of 8 or more, such as a metal oxide, a metal oxynitride, a silicate, or a nitrogen-containing silicate. The high-k material may be an oxide, an oxynitride, a silicate or a nitrogen-containing silicate of a metal such as hafnium (Hf), zirconium (Zr) or yttrium (Y), and one example of the high-k material is HfSiON mentioned above. The first gate electrode 30a includes a lower conductive film 15a made of tantalum nitride (TaN; conductive material) containing aluminum (Al), which is the second metal, and having a thickness of 4 nm, a first conductive film 18a made of titanium nitride (TiN) and having a thickness of 11 nm, and a first silicon film 19a made of polysilicon and having a thickness of 90 nm, wherein these films are formed in this order starting from the bottom (from the side of the first gate insulating film 13a). The silicide layer 26 is formed on the first silicon film 19a.

The P-type MISFET includes a second gate insulating film 13b formed on the second active region 10b, a second gate electrode 30b formed on the second gate insulating film 13b, a second sidewall 24b formed on a side surface of the second gate electrode 30b with a second offset spacer 20b interposed therebetween (the second sidewall 24b includes a second inner sidewall 22b having an L-shaped cross section and a second outer sidewall 23b), a p-type extension region 21b of a relatively small junction depth formed in a portion of the second active region 10b that is below and beside the second gate electrode 30b, a p-type source/drain region 25b of a relatively large junction depth formed in a portion of the second active region 10b that is below and beside the second sidewall 24b, and the silicide layer 26 formed on the p-type source/drain region 25b and on the second gate electrode 30b.

The second gate insulating film 13b includes a second base film (not shown) made of SiON and a second high-k film made of HfSiON containing Al, which is the second metal, wherein these films are formed in this order starting from the bottom (from the side of the second active region 10b). The second high-k film is made of the same high-k material as the first high-k film.

The second gate electrode 30b includes a second conductive film 18b made of TiN and having a thickness of 11 nm and a second silicon film 19b made of polysilicon and having a thickness of 90 nm, wherein these films are formed in this order starting from the bottom (from the side of the second gate insulating film 13b). The silicide layer 26 is formed on the second silicon film 19b. The second conductive film 18b is made of the same material as the first conductive film 18a, and the second silicon film 19b is made of the same material as the first silicon film 19a. Unlike the first gate electrode 30a, the second gate electrode 30b has no lower conductive film, and the thickness of the first gate electrode 30a is therefore greater than that of the second gate electrode 30b.

A structural characteristic of the semiconductor device of the present embodiment is as follows.

The semiconductor device of the present embodiment is a CMISFET, and the N-type MISFET of the CMISFET includes a gate insulating film and a gate electrode with optimal properties therefor, and the P-type MISFET of the CMISFET includes gate insulating film and a gate electrode with optimal properties therefor. Specifically, the first high-k film of the first gate insulating film 13a in the N-type MISFET contains La, which is the first metal. The second high-k film of the second gate insulating film 13b in the P-type MISFET contains Al, which is the second metal. The first high-k film does not contain Al, which is the second metal, and the second high-k film does not contain La, which is the first metal.

The first metal, when added to the high-k film, lowers the effective work function of the transistor. In addition to La mentioned above, the first metal may be a lanthanoid element other than La, scandium (Sc), strontium (Sr) or magnesium (Mg), for example. On the other hand, the second metal, when added to the high-k film, increases the effective work function of the transistor. In addition to Al mentioned above, the second metal may be tantalum (Ta), for example. Thus, the effective work function of the N-type MISFET can be controlled to be lower than that of the P-type MISFET. Specifically, the effective work function of the N-type MISFET can be controlled to be lower than the midgap (about 4.6 eV), preferably 4.4 eV or less, and the effective work function of the P-type MISFET can be controlled to be higher than the midgap (about 4.6 eV), preferably 4.75 eV or more. Therefore, it is possible to decrease the threshold voltage of the N-type MISFET and that of the P-type MISFET.

The term "effective work function" is used herein to distinguish the work function of the MISFET from that of the gate electrode because a MISFET usually exhibits a different work function than that of the gate electrode. The "midgap" refers to the intermediate value of the bandgap of silicon, and the midgap value is about 4.6 eV as mentioned above.

As will later be illustrated in the description of the manufacturing method, a heat treatment diffuses the first metal into a portion of a high-k film 13 that is present over the first active region 10a, and diffuses the second metal into a portion of the high-k film 13 that is present over the second active region 10b. Therefore, it is believed that the distribution, or the like, of the first metal in the N-type MISFET and the distribution, or the like, of the second metal in the P-type MISFET vary depending on the conditions of the heat treatment. However, in any case, the effective work function of the N-type MISFET can be controlled to be lower than that of the P-type MISFET as long as the first metal is contained in the first high-k film of the first gate insulating film 13a of the N-type MISFET and the second metal is contained in the second high-k film of the second gate insulating film 13b of the P-type MISFET. An example of the distribution, or the like, of the first metal in the N-type MISFET and that of the second metal in the P-type MISFET will now be described.

An example of the distribution of the first metal in the N-type MISFET is as follows. That is, the first metal may be evenly mixed with the first high-k material, may be present in a layer in the first high-k film of the first gate insulating film 13a, may be present dominantly in an upper portion of the first high-k film of the first gate insulating film 13a, may be precipitated in a lower portion of the first high-k film of the first gate insulating film 13a, or may be contained also in the lower conductive film 15a of the first gate electrode 30a.

In the N-type MISFET, the second metal is contained in the lower conductive film 15a of the first gate electrode 30a as described above. Moreover, in the N-type MISFET, the second metal may be contained also in the first conductive film 18a of the first gate electrode 30a. Furthermore, in the N-type MISFET, a film containing a conductive material of the lower conductive film 15a and the second metal may be formed between the lower conductive film 15a and the first conductive film 18a in the first gate electrode 30a. However, in order to realize the effect of controlling the effective work function of the N-type MISFET to be lower than that of the P-type MISFET, it is preferred that the second metal is absent in the lower conductive film 15a and the first conductive film 18a of the first gate electrode 30a, and it is preferred that a film containing a conductive material of the lower conductive film 15a and the second metal is absent between the lower conductive film 15a and the first conductive film 18a in the first gate electrode 30a.

An example of the distribution of the second metal in the P-type MISFET is as follows. That is, the second metal may be evenly mixed with the second high-k material, may be present in a layer in the second high-k film of the second gate insulating film 13b, may be present dominantly in an upper portion of the second high-k film of the second gate insulating film 13b, may be precipitated in a lower portion of the second high-k film of the second gate insulating film 13b, or may be contained also in the second conductive film 18b.

As described above, in the semiconductor device of the present embodiment, the first high-k film of the first gate insulating film 13a in the N-type MISFET contains the first metal, and the effective work function of the transistor is decreased if the first metal is added to the high-k film. Moreover, the second high-k film of the second gate insulating film 13b in the P-type MISFET contains the second metal, and the effective work function of the transistor is increased if the second metal is added to the high-k film. As a result, the effective work function of the N-type MISFET can be controlled to be lower than that of the P-type MISFET, thereby decreasing the threshold voltage of the N-type MISFET and that of the P-type MISFET. Thus, in the present embodiment, it is possible to realize a CMISFET in which the N-type MISFET and the P-type MISFET each include a gate insulating film and a gate electrode with optimal properties therefor.

Moreover, in the semiconductor device of the present embodiment, the first high-k film of the first gate insulating film 13 a is made of the same material as that of the second high-k film of the second gate insulating film 13b. Therefore, it is possible to prevent the upper surface of the device isolation region 11 from being exposed from the step in which the high-k film 13 is formed on the semiconductor substrate 10 until the step in which the gate electrode and the gate insulating film are formed by patterning. Therefore, the semiconductor device of the present embodiment is manufactured without an undercut portion being formed on the upper surface of the device isolation region 11, thus preventing a polysilicon residual from being left on the upper surface of the device isolation region 11. This will be further illustrated in the description of the method for manufacturing a semiconductor device below.

A method for manufacturing a semiconductor device of the first embodiment will now be described. FIGS. 2A to 2D and 3A to 3C are cross-sectional views sequentially showing steps of the method for manufacturing a semiconductor device of the first embodiment.

Figure 2A:
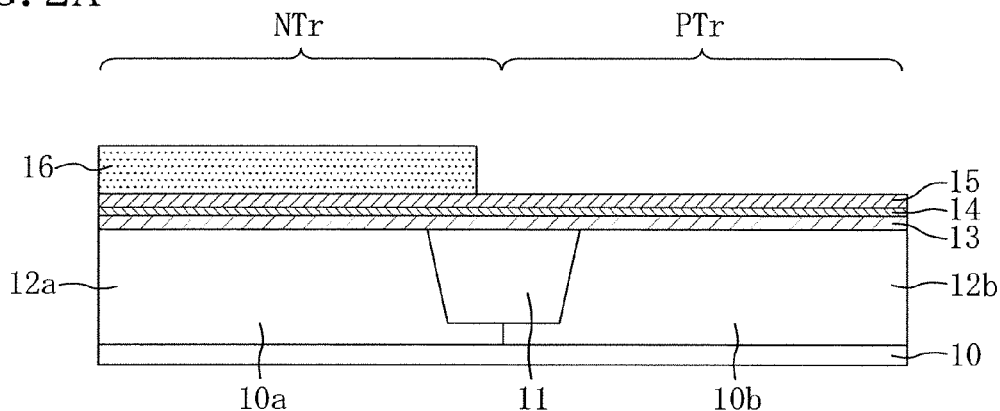
FIGS. 2A to 2D are cross-sectional views sequentially showing steps of a method for manufacturing a semiconductor device of the first embodiment.

First, as shown in FIG. 2A, a shallow trench isolation (STI) method is used to selectively form the device isolation region 11 by filling a trench with an insulating film in an upper portion of the semiconductor substrate 10 made of p-type silicon. Thus, the first active region 10a, which is a portion of the semiconductor substrate 10 that is surrounded by the device isolation region 11, is formed in the N-type MISFET formation region Ntr, and the second active region 10b, which is another portion of the semiconductor substrate 10 that is surrounded by the device isolation region 11, is formed in the P-type MISFET formation region PTr. Then, the p-type well region 12a is formed in the N-type MISFET formation region Ntr of the semiconductor substrate 10, and the n-type well region 12b is formed in the P-type MISFET formation region PTr thereof.

Then, a base film (not shown), which is a silicon oxynitride film (SiON film) having a thickness of 1.6 nm, is formed across the entire upper surface of the semiconductor substrate 10, and then the high-k film 13, which is an HfSiON film having a thickness of 2 nm, is formed on the base film by a metal organic chemical vapor deposition (MOCVD) method, for example, (step (a)). Therefore, as shown in FIG. 2A, the high-k film 13 is formed not only on the first active region 10a and on the second active region 10b, but also on the device isolation region 11. As described above, the high-k film 13 is preferably an insulating film having a relative dielectric constant higher than that of a silicon oxide film or a silicon nitride film, and made of a high-k material having a relative dielectric constant of 8 or more, including a metal oxide, a metal oxynitride, a silicate or a nitrogen-containing silicate. Then, a first material film 14 made of $La_2O_3$ having a thickness of 0.5 nm is formed on the high-k film 13. The first material film 14 is not limited to an $La_2O_3$ film, but may be any film containing a metal (i.e., the first metal) that decreases the effective work function of the transistor (specifically, lower than the midgap, preferably 4.4 eV or less) when being diffused into the high-k film 13 in a subsequent heat treatment step (the step shown in FIG. 2D). Then, a lower conductive film 15 made of TaN having a thickness of 4 nm is formed on the first material film 14 by using a PVD (Physical Vapor Deposition) method, for example. Then, a resist pattern 16 is formed on the lower conductive film 15 by a photolithography method so that a portion of the lower conductive film 15 that is formed over the first active region 10a is covered while a portion of the lower conductive film 15 that is formed over the second active region 10b is exposed.

Figure 2B:
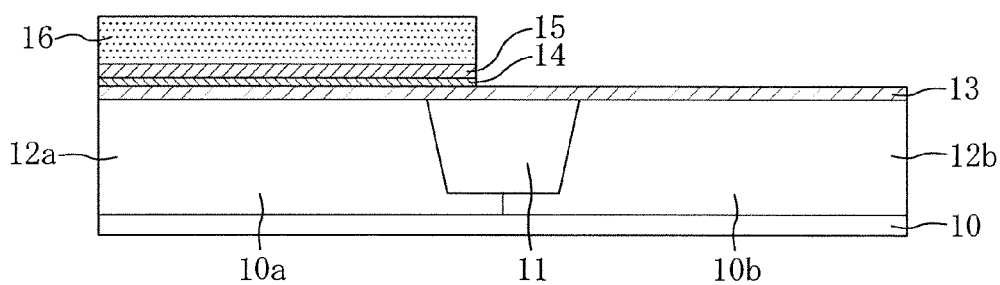

Then, as shown in FIG. 2B, a portion of the lower conductive film 15 and the first material film 14 that is formed over the second active region 10b is removed by using the resist pattern 16 as a mask. Thus, a base film (not shown), the high-k film 13, the first material film 14 and the lower conductive film 15 are formed in this order over the first active region 10a (step (b)), whereas the base film (not shown) and the high-k film 13 are formed in this order over the second active region 10b. The lower conductive film 15 made of TaN can be removed by wet etching using a chemical solution whose main component is sulfuric acid ($H_2SO_4$). The first material film 14 made of $La_2O_3$ can be removed by wet etching using a chemical solution whose main component is hydrochloric acid (HCl). Since the etching rate of HfSiON for the chemical solution used for removing $La_2O_3$ (HCl in the present embodiment) is significantly different from that of $La_2O_3$, and the etching selectivity for the chemical solution used for removing $La_2O_3$ (i.e., the ratio of the etching rate of HfSiON to that of $La_2O_3$) is small, it is possible to easily remove only the lower conductive film 15 and the first material film 14 while leaving the high-k film 13 over the device isolation region 11. Since the high-k film 13 is not removed in the etching step, it is possible to prevent the upper surface of the device isolation region 11 from being exposed, and thus to suppress the formation of the undercut portion on the upper surface of the device isolation region 11.

Figure 2C:
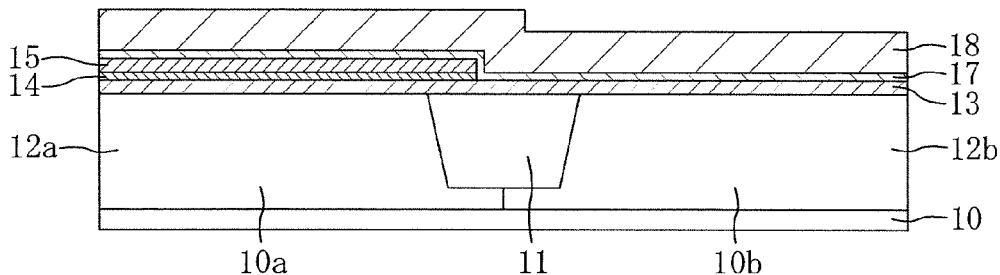

Then, as shown in FIG. 2C, a second material film 17 made of $Al_2O_3$ having a thickness of 0.5 nm is formed by a chemical vapor deposition (CVD) method, for example, on a portion of the high-k film 13 that is provided over the second active region 10b and on the lower conductive film 15 (step (c)). The second material film 17 is not limited to an $Al_2O_3$ film, but may be any film containing a metal (i.e., the second metal) that increases the effective work function of the transistor (specifically, higher than the midgap, preferably 4.75 eV or more) when diffused into the high-k film 13 in a subsequent heat treatment step (the step shown in FIG. 2D). Then, a conductive film 18 made of TiN having a thickness of 11 nm is formed on the second material film 17 by using, for example, a physical vapor deposition (PVD) method (step (d)).

Figure 2D:
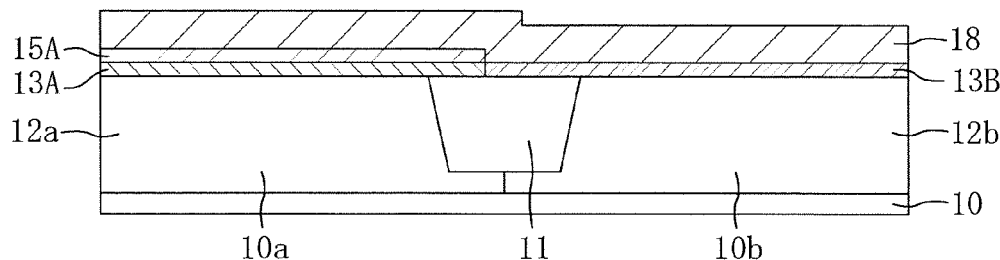

Then, as shown in FIG. 2D, the semiconductor substrate 10 is subjected to, for example, a heat treatment at 800° C. for 10 minutes (step (g)). Then, La, which is the first metal, diffuses from inside the first material film 14 into a portion of the high-k film 13 that is formed over the first active region 10a, thereby forming an La-containing high-k film 13A over the first active region 10a. Al, which is the second metal, diffuses from inside the second material film 17 into a portion of the high-k film 13 that is formed over the second active region 10b, thereby forming an Al-containing high-k film 13B over the second active region 10b. The second metal also diffuses from inside the second material film 17 into the lower conductive film 15, thereby forming an Al-containing lower conductive film 15A on the La-containing high-k film 13A. In order to realize the effect of controlling the effective work function of the N-type MISFET to be lower than that of the P-type MISFET, it is preferred that the second metal is not allowed to diffuse from inside the second material film 17 into the lower conductive film 15. Therefore, it is preferred that the second material film 17 is not provided on the lower conductive film 15 in the step shown in FIG. 2C.

Depending on the heat treatment conditions in this heat treatment step, the first metal may be evenly mixed with the high-k material of the high-k film 13 in the La-containing high-k film 13A, may be present in a layer in the La-containing high-k film 13A, may be present dominantly in an upper portion of the La-containing high-k film 13A, may be precipitated in a lower portion of the La-containing high-k film 13A, or may diffuse from inside the first material film 14 into the lower conductive film 15.

Similarly, depending on the heat treatment conditions in the heat treatment step, the second metal may be evenly mixed with the high-k material of the high-k film 13 in the Al-containing high-k film 13B, may be present in a layer in the Al-containing high-k film 13B, may be present dominantly in an upper portion of the Al-containing high-k film 13B, may be precipitated in a lower portion of the Al-containing high-k film 13B, or may diffuse from inside the second material film 17 into the conductive film 18.

Moreover, depending on the heat treatment conditions in the heat treatment step, the first material film 14 may disappear as shown in FIG. 2D or remain to be integrated with the La-containing high-k film 13A (not shown) upon completion of the heat treatment step.

Similarly, depending on the heat treatment conditions in the heat treatment step, the second material film 17 may disappear as shown in FIG. 2D or remain to be integrated with the Al-containing high-k film 13B (not shown) upon completion of the heat treatment step. Moreover, a film containing the conductive material of the lower conductive film 15 and the second metal may remain between the Al-containing lower conductive film 15A and the conductive film 18. However, in order to realize the effect of controlling the effective work function of the N-type MISFET to be lower than that of the P-type MISFET, it is preferred that a film containing the conductive material of the lower conductive film 15 and the second metal is not allowed to remain between the Al-containing lower conductive film 15A and the conductive film 18, and it is preferred that the second material film 17 is not provided on the lower conductive film 15 in the step shown in FIG. 2C.

Figure 3A:
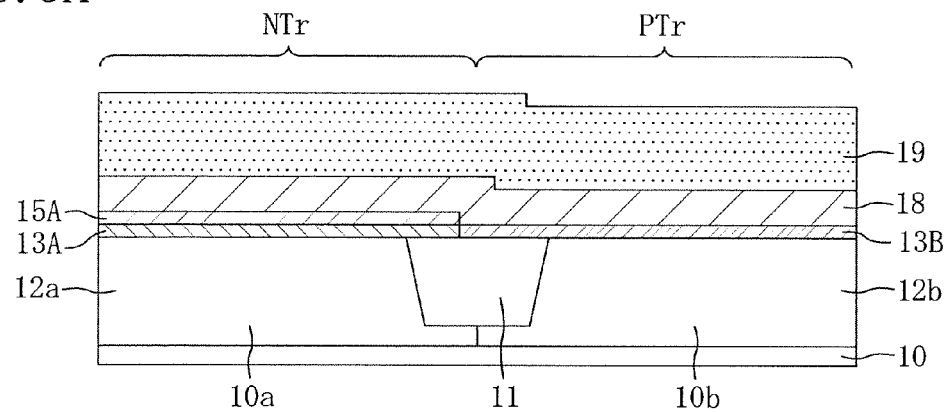
FIGS. 3A to 3C are cross-sectional views sequentially showing steps of the method for manufacturing a semiconductor device of the first embodiment.

Then, as shown in FIG. 3A, a silicon film 19 having a thickness of 90 nm is formed on the conductive film 18 (step (e)). Since the undercut portion is absent on the upper surface of the device isolation region 11, it is possible to prevent the silicon film 19 from being deposited on the upper surface of the device isolation region 11. Therefore, even if the silicon film 19 is etched in the next step, a residual thereof is prevented from being left on the upper surface of the device isolation region 11.

Figure 3B:
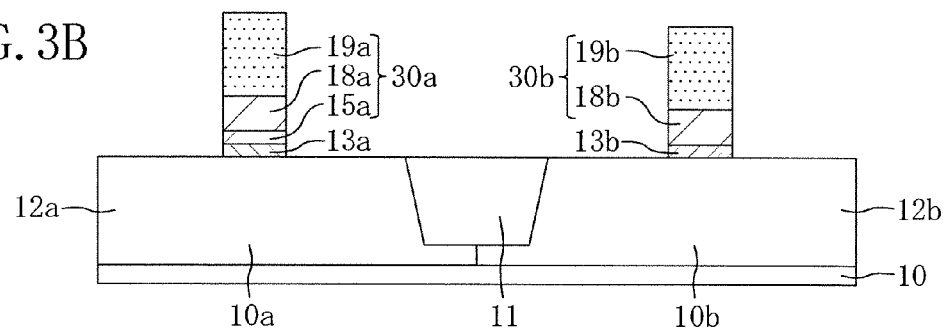

Then, as shown in FIG. 3B, the silicon film 19, the conductive film 18, the Al-containing lower conductive film 15A, the La-containing high-k film 13A and the Al-containing high-k film 13B are patterned by a dry etching method using a resist having a gate pattern shape (not shown) (step (f)). As a result, the first gate insulating film 13a, which includes the first base film and the La-containing high-k film 13A, and the first gate electrode 30a, which includes the lower conductive film 15a made of the Al-containing lower conductive film 15A, the first conductive film 18a and the first silicon film 19a, are formed in this order over the first active region 10a. On the other hand, the second gate insulating film 13b, which includes the second base film and the Al-containing high-k film 13B, and the second gate electrode 30b, which includes the second conductive film 18b and the second silicon film 19b, are formed in this order over the second active region 10b.

Figure 3C:
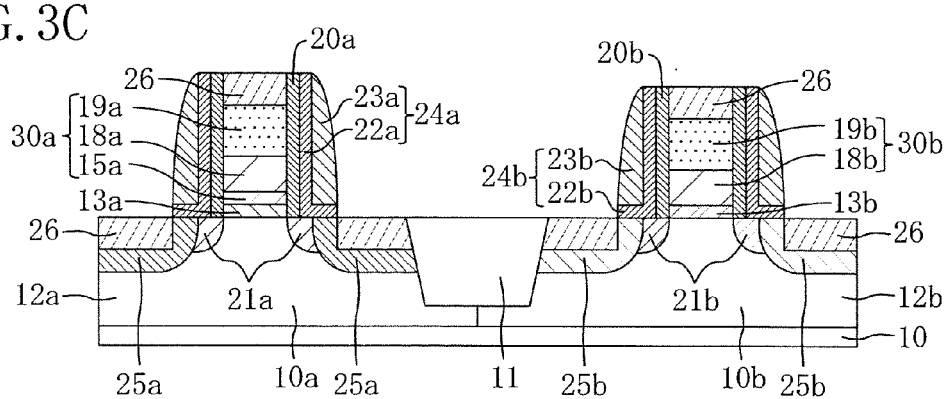

Then, as shown in FIG. 3C, after the first and second offset spacers 20a and 20b are formed on the side surface of the first and second gate electrodes 30a and 30b, respectively, the n-type extension region 21a is formed in a portion of the first active region 10a that is below and beside the first gate electrode 30a, and the p-type extension region 21b is formed in a portion of the second active region 10b that is below and beside the second gate electrode 30b. Then, the first sidewall 24a, which includes the L-shaped first inner sidewall 22a and the first outer sidewall 23a, is formed on the side surface of the first gate electrode 30a with the first offset spacer 20a interposed therebetween, and the second sidewall 24b, which includes the L-shaped second inner sidewall 22b and the second outer sidewall 23b, is formed on the side surface of the second gate electrode 30b with the second offset spacer 20b interposed therebetween. Then, the n-type source/drain region 25a is formed in a portion of the first active region 10a that is below and beside the first sidewall 24a, and the p-type source/drain region 25b is formed in a portion of the second active region 10b that is below and beside the second sidewall 24b. Then, the silicide layer 26 made of nickel silicide, or the like, is formed in an upper portion of the first silicon film 19a of the first gate electrode 30a, an upper portion of the second silicon film 19b of the second gate electrode 30b, an upper portion of the n-type source/drain region 25a, and an upper portion of the p-type source/drain region 25b. Thus, there is obtained a semiconductor device including an N-type MISFET over the first active region 10a and a P-type MISFET over the second active region 10b.

As described above, in the method for manufacturing a semiconductor device of the present embodiment, the high-k film 13 is formed so as to cover the entire upper surface of the semiconductor substrate 10 in the step shown in FIG. 2A. Then, in the step shown in FIG. 2B, the lower conductive film 15 and the first material film 14 are removed selectively but the high-k film 13 is not removed. Therefore, the upper surface of the device isolation region 11 remains covered by the high-k film 13, and it is thus possible to prevent an undercut portion from being formed on the upper surface of the device isolation region 11. Therefore, even if the silicon film 19 is etched in the step shown in FIG. 3B after depositing the silicon film 19 in the step shown in FIG. 3A, a polysilicon residual can be prevented from being left on the upper surface of the device isolation region 11. Thus, in the method for manufacturing a semiconductor device of the present embodiment, it is possible to suppress the occurrence of a residual of the gate electrode material on the upper surface of the device isolation region 11, which has been a cause of a defect in conventional semiconductor devices.

Moreover, in the method for manufacturing a semiconductor device of the present embodiment, since the high-k film 13 is formed so as to cover the entire upper surface of the semiconductor substrate 10 in the step shown in FIG. 2A, the high-k film 13 is formed over the first active region 10a and also over the second active region 10b. However, in the step shown in FIG. 2D, the first metal is allowed to diffuse into a portion of the high-k film 13 that is formed over the first active region 10a, and the second metal is allowed to diffuse into a portion of the high-k film 13 that is formed over the second active region 10b. The first metal is a metal that decreases the effective work function of the transistor when being diffused into the high-k film, and the second metal is a metal that increases the effective work function of the transistor when being diffused into the high-k film. As a result, the effective work function of the N-type MISFET can be controlled to be lower than that of the P-type MISFET, thereby decreasing the threshold voltage of the N-type MISFET and that of the P-type MISFET.

Moreover, in the method for manufacturing a semiconductor device of the present embodiment, the second material film 17 is formed, after selectively removing the lower conductive film 15 and the first material film 14, in the second active region 10b (FIG. 2C). Therefore, in the second active region 10b, even if film-thinning and damage occur to the high-k film 13 when selectively removing the lower conductive film 15 and the first material film 14, the second material film 17 can be formed so as to cancel out the influence of the film-thinning and damage to the high-k film 13. Therefore, the second gate insulating film 13b having a high reliability can be formed on the second active region 10b.

In summary, with the semiconductor device of the present embodiment and a method for manufacturing the same, the threshold voltage of the N-type MISFET and that of the P-type MISFET can be decreased, and it is possible to manufacture a semiconductor device without leaving a residual of the gate electrode material on the upper surface of the device isolation region 11, which has been a cause of a defect in conventional semiconductor devices.

Second Embodiment

Figure 4:
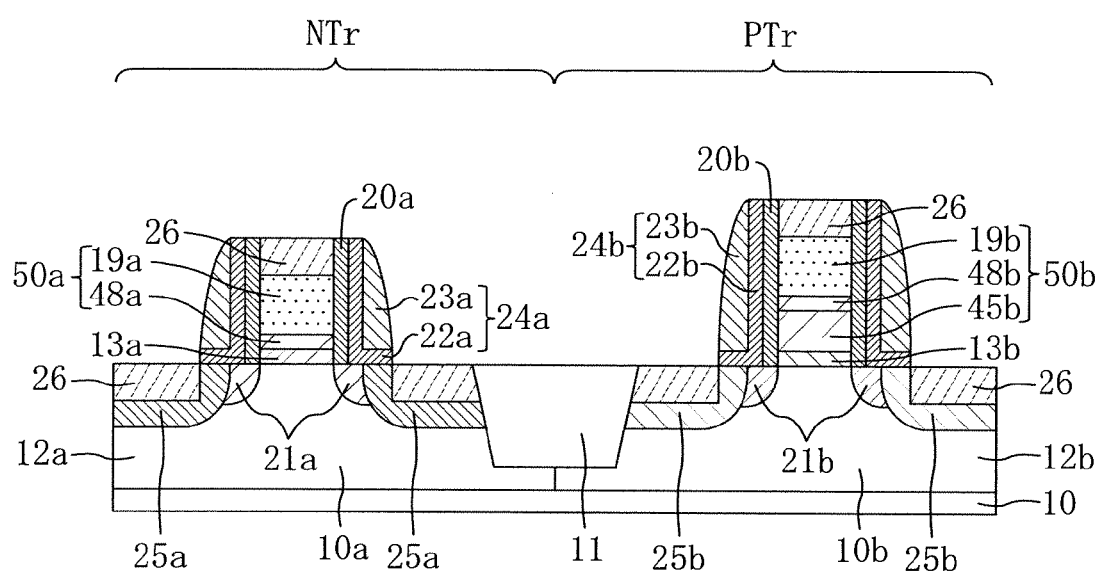
FIG. 4 is a cross-sectional view showing a semiconductor device of a second embodiment.
Figure 6A:
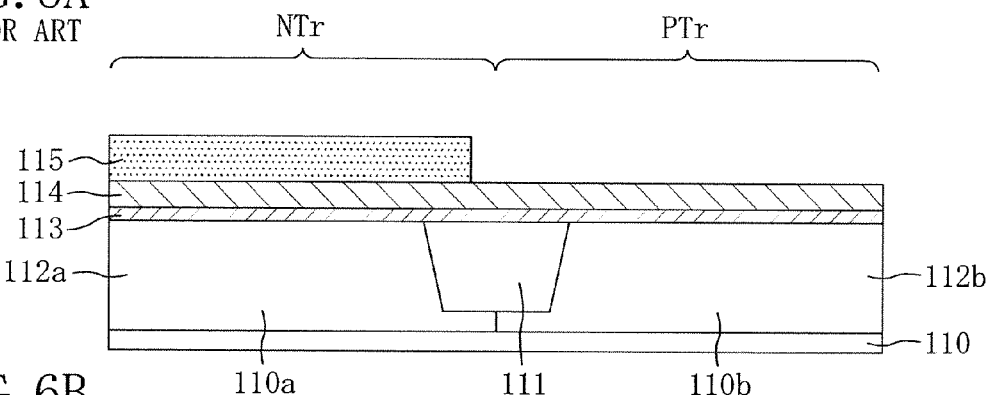
FIGS. 6A to 6D are cross-sectional views sequentially showing steps of a conventional method for manufacturing a semiconductor device.
Figure 6B:
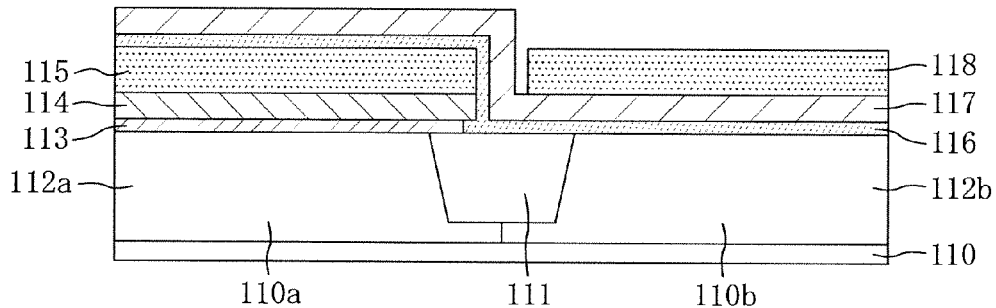
Figure 6C:
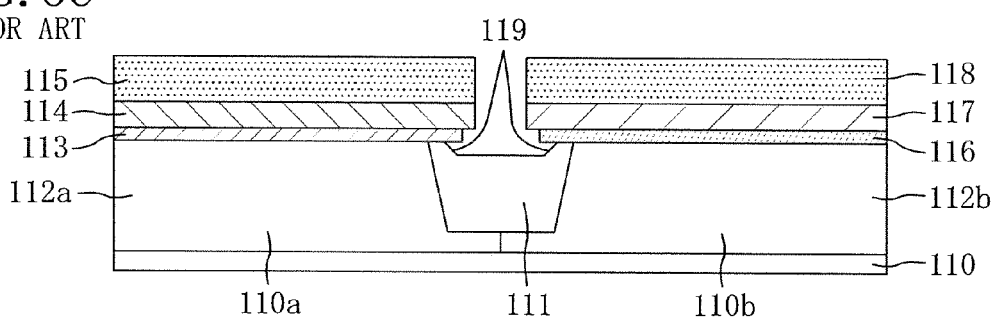
Figure 6D:
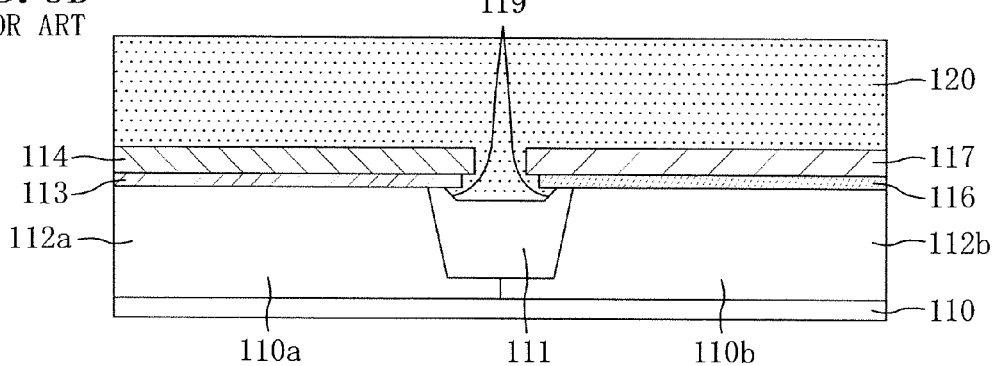
Figure 7A:
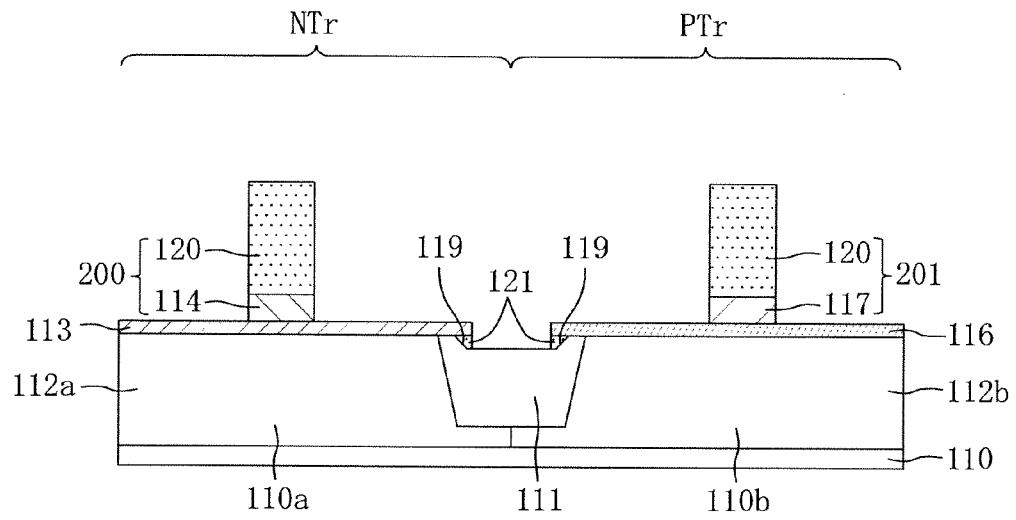
FIGS. 7A to 7B are cross-sectional views sequentially showing steps of the conventional method for manufacturing a semiconductor device.
Figure 7B:
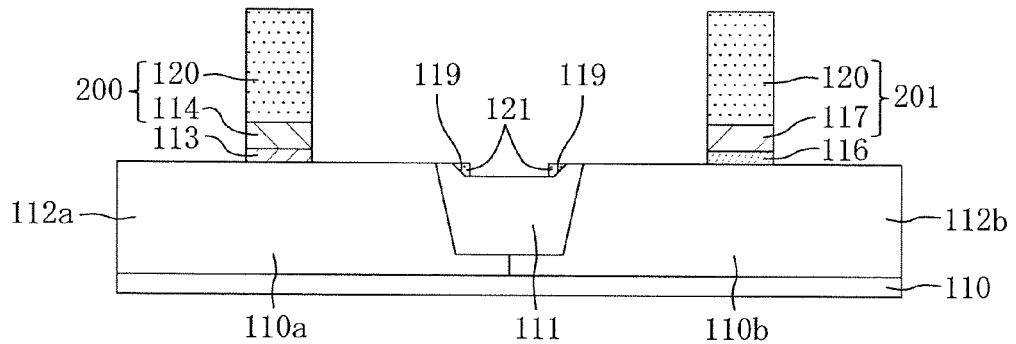

A semiconductor device of a second embodiment and a method for manufacturing the same will be described with reference to the drawings. First, the structure of the semiconductor device of the second embodiment will be described with reference to FIG. 4. FIG. 4 shows a cross section of the semiconductor device of the second embodiment. In the figures, "NTr" on the left denotes an N-type MISFET formation region Ntr where an N-type MISFET is formed, and "PTr" on the right denotes a P-type MISFET formation region PTr where a P-type MISFET is formed. In the present embodiment, as compared with the first embodiment, the first gate electrode provided in the N-type MISFET is a 2-layer electrode including a first conductive film and a first silicon film, and the second gate electrode provided in the P-type MISFET is a S-layer electrode including a lower conductive film, a second conductive film and a second silicon film.

As shown in FIG. 4, in an upper portion of a semiconductor substrate 10, a device isolation region 11 is formed by filling a trench with an insulating film so as to partition between a first active region 10a where a p-type well region 12a is formed and a second active region 10b where an n-type well region 12b is formed. The semiconductor device includes an N-type MISFET provided in the first active region 10a of the N-type MISFET formation region Ntr, and a P-type MISFET provided in the second active region 10b of the P-type MISFET formation region PTr.

The N-type MISFET includes a first gate insulating film 13a formed on the first active region 10a, a first gate electrode 50a formed on the first gate insulating film 13a, a first sidewall 24a formed on a side surface of the first gate electrode 50a with a first offset spacer 20a interposed therebetween (the first sidewall 24a includes a first inner sidewall 22a having an L-shaped cross section and a first outer sidewall 23a), an n-type extension region 21a of a relatively small junction depth formed in a portion of the first active region 10a that is below and beside the first gate electrode 50a, an n-type source/drain region 25a of a relatively large junction depth formed in a portion of the first active region 10a that is below and beside the first sidewall 24a, and a silicide layer 26 formed on the n-type source/drain region 25a and on the first gate electrode 50a.

The first gate insulating film 13a includes a first base film (not shown) made of SiON and a first high-k film made of HfSiON containing La, which is the first metal, wherein these films are formed in this order starting from the bottom (from the side of the first active region 10a). The first high-k film is an insulating film having a relative dielectric constant that is greater than that of a silicon oxide film or a silicon oxynitride film, and is made of a high-k material having a relative dielectric constant of 8 or more, such as a metal oxide, a metal oxynitride, a silicate, or a nitrogen-containing silicate. The high-k material may be an oxide, an oxynitride, a silicate or a nitrogen-containing silicate of a metal such as Hf, Zr or Y, and one example of the high-k material is HfSiON mentioned above. The first gate electrode 50a includes a first conductive film 48a made of TiN and having a thickness of 4 nm, and a first silicon film 19a made of polysilicon and having a thickness of 90 nm, wherein these films are formed in this order starting from the bottom (from the side of the first gate insulating film 13a). The silicide layer 26 is formed on the first silicon film 19a.

The P-type MISFET includes a second gate insulating film 13b formed on the second active region 10b, a second gate electrode 50b formed on the second gate insulating film 13b, a second sidewall 24b formed on a side surface of the second gate electrode 50b with a second offset spacer 20b interposed therebetween (the second sidewall 24b includes a second inner sidewall 22b having an L-shaped cross section and a second outer sidewall 23b), a p-type extension region 2 1b of a relatively small junction depth formed in a portion of the second active region 10b that is below and beside the second gate electrode 50b, a p-type source/drain region 25b of a relatively large junction depth formed in a portion of the second active region 10b that is below and beside the second sidewall 24b, and the silicide layer 26 formed on the p-type source/drain region 25b and on the second gate electrode 50b.

The second gate insulating film 13b includes a second base film (not shown) made of SiON and a second high-k film made of HfSiON containing Al, which is the second metal, wherein these films are formed in this order starting from the bottom (from the side of the second active region 10b). The second high-k film is made of the same high-k material as the first high-k film.

The second gate electrode 50b includes a lower conductive film 45b made of TiN (conductive material) containing the first metal and having a thickness of 11 nm, a second conductive film 48b made of TiN and having a thickness of 4 nm, and a second silicon film 19b made of polysilicon and having a thickness of 90 nm, wherein these films are formed in this order starting from the bottom (from the side of the second gate insulating film 13b). The silicide layer 26 is formed on the second silicon film 19b. The second conductive film 48b is made of the same material as the first conductive film 48a, and the second silicon film 19b is made of the same material as the first silicon film 19a. Unlike the first gate electrode 50a, the second gate electrode 50b includes the lower conductive film 45b, and therefore the thickness thereof is greater than that of the first gate electrode 50a.

A structural characteristic of the semiconductor device of the present embodiment is as follows.

The semiconductor device of the present embodiment is a CMISFET, and the N-type MISFET of the CMISFET includes a gate insulating film and a gate electrode with optimal properties therefor, and the P-type MISFET of the CMISFET includes gate insulating film and a gate electrode with optimal properties therefor. First, the gate insulating film will be described.

The first high-k film of the first gate insulating film 13a in the N-type MISFET contains La, which is the first metal. The second high-k film of the second gate insulating film 13b in the P-type MISFET contains Al, which is the second metal. The first high-k film does not contain the second metal, and the second high-k film does not contain the first metal.

The first metal, when added to the high-k film, lowers the effective work function of the transistor. In addition to La mentioned above, the first metal may be a lanthanoid element other than La, Sc, Sr or Mg, for example. On the other hand, the second metal, when added to the high-k film, increases the effective work function of the transistor. In addition to Al mentioned above, the second metal may be Ta, for example. Thus, the effective work function of the N-type MISFET can be controlled to be lower than that of the P-type MISFET. Specifically, the effective work function of the N-type MISFET can be controlled to be lower than the midgap (about 4.6 eV), preferably 4.4 eV or less, and the effective work function of the P-type MISFET can be controlled to be higher than the midgap (about 4.6 eV), preferably 4.75 eV or more. Therefore, it is possible to decrease the threshold voltage of the N-type MISFET and that of the P-type MISFET.

As will later be illustrated in the description of the manufacturing method, a heat treatment diffuses the first metal into a portion of a high-k film 13 that is present over the first active region 10a, and diffuses the second metal into a portion of the high-k film 13 that is present over the second active region 10b. Therefore, it is believed that the distribution, or the like, of the first metal in the N-type MISFET and the distribution, or the like, of the second metal in the P-type MISFET vary depending on the conditions of the heat treatment. However, in any case, the effective work function of the N-type MISFET can be controlled to be lower than that of the P-type MISFET as long as the first metal is contained in the first high-k film of the first gate insulating film 13a of the N-type MISFET and second metal is contained in the second high-k film of the second gate insulating film 13b of the P-type MISFET. An example of the distribution, or the like, of the first metal in the N-type MISFET and that of the second metal in the P-type MISFET will now be described.

An example of the distribution of the first metal in the N-type MISFET is as follows. That is, the first metal may be evenly mixed with the first high-k material, may be present in a layer in the first high-k film of the first gate insulating film 13a, may be present dominantly in an upper portion of the first high-k film of the first gate insulating film 13a, may be precipitated in a lower portion of the first high-k film of the first gate insulating film 13a, or may be contained also in the first conductive film 48a of the first gate electrode 50a.

In the N-type MISFET, the first metal may be contained, in the form of a metal, in the first high-k film of the first gate insulating film 13a, or may be contained, in the form of a metal oxide ($La_2O_3$ in the present embodiment) or the like, in the first high-k film of the first gate insulating film 13a.

An example of the distribution of the second metal in the P-type MISFET is as follows. That is, the second metal may be evenly mixed with the second high-k material, may be present in a layer in the second high-k film of the second gate insulating film 13b, may be present dominantly in an upper portion of the second high-k film of the second gate insulating film 13b, may be precipitated in a lower portion of the second high-k film of the second gate insulating film 13b, or may be contained also in the lower conductive film 45b of the second gate electrode 50b.

In the P-type MISFET, the second metal may be contained, in the form of a metal, in the second high-k film of the second gate insulating film 13b, or may be contained, in the form of a metal oxide ($Al_2O_3$ in the present embodiment) or the like, in the second high-k film of the second gate insulating film 13b.

In the P-type MISFET, the first metal is contained in the lower conductive film 45b of the second gate electrode 50b as described above. Moreover, in the P-type MISFET, the first metal may be contained also in the second conductive film 48b of the second gate electrode 50b. Furthermore, in the P-type MISFET, a film containing a conductive material of the lower conductive film 45b and the first metal may be formed between the lower conductive film 45b and the second conductive film 48b in the second gate electrode 50b. However, in order to realize the effect of controlling the effective work function of the P-type MISFET to be higher than that of the N-type MISFET, it is preferred that the first metal is absent in the lower conductive film 45b and the second conductive film 48b of the second gate electrode 50b, and it is preferred that a film containing a conductive material of the lower conductive film 45b and the first metal is absent between the lower conductive film 45b and the second conductive film 48b in the second gate electrode 50b.

Next, the gate electrode will be described.

The first gate electrode 50a in the N-type MISFET includes the first conductive film 48a and the first silicon film 19a. The first conductive film 48a is a TiN film having a thickness of 4 nm. Thus, the first conductive film 48a is thinner than the first conductive film 18a of the first embodiment (a TiN film having a thickness of 11 nm). Generally, if the thickness of a TiN film is less than or equal to a certain thickness (specifically, about 20 nm or less for a TiN film formed by an ALD (Atomic Layer Deposition) method), the effective work function of the transistor is lower as the thickness of the TiN film is smaller. Therefore, in the N-type MISFET of the present embodiment, the effective work function can be made even lower than that of the N-type MISFET of the first embodiment.

The second gate electrode 50b in the P-type MISFET includes the lower conductive film 45b, the second conductive film 48b and the second silicon film 19b. The lower conductive film 45b is made of TiN and has a thickness of 11 nm. The second conductive film 48b is a TiN film having a thickness of 4 nm, as is the first conductive film 48a. Thus, the second gate electrode 50b includes TiN films having a total thickness of 15 nm, which is thicker than the TiN film of the second gate electrode 30b of the first embodiment (the second conductive film 18b having a thickness of 11 nm). As described above, if the thickness of the TiN film is less than or equal to a certain thickness, the effective work function of the transistor is higher as the thickness of the TiN film is larger. Therefore, the effective work function of the P-type MISFET of the present embodiment can be made even higher than that of the P-type MISFET of the first embodiment.

As described above, in the semiconductor device of the present embodiment, the first high-k film of the first gate insulating film 13a in the N-type MISFET contains the first metal, and the effective work function of the transistor is decreased if the first metal is added to the high-k film, as in the first embodiment. Moreover, the second high-k film of the second gate insulating film 13b in the P-type MISFET contains the second metal, and the effective work function of the transistor is increased if the second metal is added to the high-k film. As a result, the effective work function of the N-type MISFET can be controlled to be lower than that of the P-type MISFET, thereby decreasing the threshold voltage of the N-type MISFET and that of the P-type MISFET. Thus, in the present embodiment, it is possible to realize a CMISFET in which the N-type MISFET and the P-type MISFET each include a gate insulating film and a gate electrode with optimal properties therefor.

Moreover, in the semiconductor device of the present embodiment, since the first conductive film 48a in the N-type MISFET is a TiN film having a smaller thickness than that of the first conductive film 18a of the first embodiment, the effective work function of the N-type MISFET can be made lower than that in the first embodiment. Furthermore, since the second conductive film 48b in the P-type MISFET is a TiN film having a larger thickness than that in the first embodiment, the effective work function of the P-type MISFET can be made higher than that in the first embodiment. As a result, in the present embodiment, the threshold voltage of the N-type MISFET and that of the P-type MISFET can be made lower than those of the first embodiment.

Moreover, in the semiconductor device of the present embodiment, the first high-k film of the first gate insulating film 13a is made of the same material as that of the second high-k film of the second gate insulating film 13b. Therefore, it is possible to prevent the upper surface of the device isolation region 11 from being exposed from the step in which the high-k film 13 is formed on the semiconductor substrate 10 until the step in which the gate electrode and the gate insulating film are formed by patterning. Therefore, since the semiconductor device of the present embodiment is manufactured without an undercut portion being formed on the upper surface of the device isolation region 11, thus preventing a polysilicon residual from being left on the upper surface of the device isolation region 11. This will be further illustrated in the description of the method for manufacturing a semiconductor device below.

A method for manufacturing a semiconductor device of the second embodiment will now be described. FIGS. 5A to 5E are cross-sectional views sequentially showing steps of a part of the method for manufacturing a semiconductor device of the second embodiment.

First, as shown in FIG. 5A, the device isolation region 11 is formed in an upper portion of the semiconductor substrate 10, as is in the first embodiment, thereby forming the first active region 10a in the N-type MISFET formation region Ntr and the second active region 10b in the P-type MISFET formation region PTr. Then, the p-type well region 12a is formed in the N-type MISFET formation region Ntr of the semiconductor substrate 10, and the n-type well region 12b is formed in the P-type MISFET formation region PTr thereof.

Then, a base film (not shown), which is an SiON film having a thickness of 1.6 nm, is formed across the entire upper surface of the semiconductor substrate 10, and then the high-k film 13, which is an HfSiON film having a thickness of 2 nm, is formed on the base film by a metal organic chemical vapor deposition method, for example, (step (a)). Therefore, the high-k film 13 is formed not only on the first active region 10a and on the second active region 10b, but also on the device isolation region 11, as is in the first embodiment. Then, a second material film 17 made of $Al_2O_3$ having a thickness of 0.5 nm is formed on the high-k film 13. The second material film 17 is not limited to an $Al_2O_3$ film, but may be any film containing a metal (i.e., the second metal) that increases the effective work function of the transistor when being diffused into the high-k film 13 in a subsequent heat treatment step (the step shown in FIG. 5D). Then, a lower conductive film 45 made of TaN having a thickness of 11 nm is formed on the second material film 17 by using a PVD method, for example. Then, a resist pattern 16 is formed on the lower conductive film 45 by a photolithography method so that a portion of the lower conductive film 45 that is formed over the second active region 10b is covered while a portion of the lower conductive film 45 that is formed over the first active region 10a is exposed.

Then, as shown in FIG. 5B, a portion of the lower conductive film 45 and the second material film 17 that is formed over the first active region 10a is removed by using the resist pattern 16 as a mask. Thus, a base film (not shown) and the high-k film 13 are formed in this order over the first active region 10a, whereas the base film (not shown), the high-k film 13, the second material film 17 and the lower conductive film 45 are formed in this order over the second active region 10b (step (b)). The lower conductive film 45 made of TiN can be removed by wet etching using a chemical solution whose main component is $H_2SO_4$. The second material film 17 made of $Al_2O_3$ can be removed by wet etching using a chemical solution whose main component is ammonium hydroxide ($NH_4OH$). Since the etching rate of HfSiON for the chemical solution used for removing the second material film 17 ($NH_4OH$ in the present embodiment) is significantly different from that of $Al_2O_3$, and the etching selectivity for the chemical solution used for removing the second material film 17 (i.e., the ratio of the etching rate of HfSiON with respect to that of $Al_2O_3$) is small, it is possible to easily remove only the lower conductive film 45 and the second material film 17 while leaving the high-k film 13 over the device isolation region 11. Since the high-k film 13 is not removed in the etching step, it is possible to prevent the upper surface of the device isolation region 11 from being exposed, and thus to suppress the formation of the undercut portion on the upper surface of the device isolation region 11.

Then, as shown in FIG. 5C, the first material film 14 made of $La_2O_3$ having a thickness of 0.5 nm is formed by a chemical vapor deposition method, for example, on a portion of the high-k film 13 that is provided over the first active region 10a and on the lower conductive film 45 (step (c)). The first material film 14 is not limited to an $La_2O_3$ film, but may be any film containing a metal (i.e., the first metal) that decreases the effective work function of the transistor when diffused into the high-k film 13 in a subsequent heat treatment step (the step shown in FIG. 5D). Then, a conductive film 48 made of TiN having a thickness of 4 nm is formed on the first material film 14 by using, for example, a physical vapor deposition method (step (d)).

Then, as shown in FIG. 5D, the semiconductor substrate 10 is subjected to, for example, a heat treatment at 800° C. for 10 minutes (step (g)). Then, La, which is the first metal, diffuses from the first material film 14 into a portion of the high-k film 13 that is formed over the first active region 10a, thereby forming an La-containing high-k film 13A over the first active region 10a. Al, which is the second metal, diffuses from the second material film 17 into a portion of the high-k film 13 that is formed over the second active region 10b, thereby forming an Al-containing high-k film 13B over the second active region 10b. The first metal also diffuses from inside the first material film 14 into the lower conductive film 45, thereby forming an La-containing lower conductive film 45B on the Al-containing high-k film 13B. In order to realize the effect of controlling the effective work function of the N-type MISFET to be lower than that of the P-type MISFET, it is preferred that the first metal is not allowed to diffuse from inside the first material film 14 into the lower conductive film 45. Therefore, it is preferred that the second material film 17 is not provided on the lower conductive film 45 in the step shown in FIG. 5C.

Depending on the heat treatment conditions in this heat treatment step, the first metal may be evenly mixed with the high-k material of the high-k film 13 in the La-containing high-k film 13A, may be present in a layer in the La-containing high-k film 13A, may be present dominantly in an upper portion of the La-containing high-k film 13A, may be precipitated in a lower portion of the La-containing high-k film 13A, or may diffuse from inside the first material film 14 into the conductive film 48.

Similarly, depending on the heat treatment conditions in the heat treatment step, the second metal may be evenly mixed with the high-k material of the high-k film 13 in the Al-containing high-k film 13B, may be present in a layer in the Al-containing high-k film 13B, may be present dominantly in an upper portion of the Al-containing high-k film 13B, may be precipitated in a lower portion of the Al-containing high-k film 13B, or may diffuse from inside the second material film 17 into the lower conductive film 45.

Moreover, depending on the heat treatment conditions in the heat treatment step, the first material film 14 may disappear as shown in FIG. 5D or remain to be integrated with the La-containing high-k film 13A (not shown) upon completion of the heat treatment step. Moreover, a film containing the conductive material of the lower conductive film 45 and the first metal may remain between the La-containing lower conductive film 45B and the conductive film 48. However, in order to realize the effect of controlling the effective work function of the N-type MISFET to be lower than that of the P-type MISFET, it is preferred that a film containing the conductive material of the lower conductive film 45 and the first metal is not allowed to remain between the La-containing lower conductive film 45B and the conductive film 48, and it is preferred that the second material film 17 is not provided on the lower conductive film 45 in the step shown in FIG. 5C.

Similarly, depending on the heat treatment conditions in the heat treatment step, the second material film 17 may disappear as shown in FIG. 5D or remain to be integrated with the Al-containing high-k film 13B (not shown) upon completion of the heat treatment step.

Then, as shown in FIG. 5E, a silicon film 19 having a thickness of 90 nm is formed on the conductive film 48 (step (e)). Since the undercut portion is absent on the upper surface of the device isolation region 11, it is possible to prevent the silicon film 19 from being formed on the upper surface of the device isolation region 11. Therefore, even if the silicon film 19 is etched in the next step, a residual thereof is prevented from being left on the upper surface of the device isolation region 11.

Then, although not shown in the figure, the silicon film 19, the conductive film 48, the La-containing lower conductive film 45B, the La-containing high-k film 13A and the Al-containing high-k film 13B are patterned by a dry etching method using a resist having a gate pattern shape (not shown). As a result, the first gate insulating film 13a, which includes the first base film and the La-containing high-k film 13A, and the first gate electrode 50a, which includes the first conductive film 48a and the first silicon film 19a, are formed in this order over the first active region 10a. On the other hand, the second gate insulating film 13b, which includes the second base film and the Al-containing high-k film 13B, and the second gate electrode 50b, which includes the second conductive film 48b made of the La-containing lower conductive film 45B and the second silicon film 19b, are formed in this order over the second active region 10b.

Then, a step similar to the step shown in FIG. 3C in the first embodiment is performed, thereby obtaining a semiconductor device in which the N-type MISFET is formed over the first active region 10a and the P-type MISFET over the second active region 10b.

As described above, in the method for manufacturing a semiconductor device of the present embodiment, the high-k film 13 is formed so as to cover the entire upper surface of the semiconductor substrate 10 in the step shown in FIG. 5A. Then, in the step shown in FIG. 5B, the lower conductive film 45 and the first material film 14 are removed selectively but the high-k film 13 is not removed. Therefore, the upper surface of the device isolation region 11 remains covered by the high-k film 13, and it is thus possible to prevent an undercut portion from being formed on the upper surface of the device isolation region 11. Therefore, even if the silicon film 19 is etched after depositing the silicon film 19 in the step shown in FIG. 5E, a polysilicon residual can be prevented from being left on the upper surface of the device isolation region 11. Thus, in the method for manufacturing a semiconductor device of the present embodiment, it is possible to suppress the occurrence of a residual of the gate electrode material on the upper surface of the device isolation region 11, which has been a cause of a defect of conventional semiconductor devices.

Moreover, in the method for manufacturing a semiconductor device of the present embodiment, since the high-k film 13 is formed so as to cover the entire upper surface of the semiconductor substrate 10 in the step shown in FIG. 5A, the high-k film 13 is formed over the first active region 10a and also over the second active region 10b. However, in the step shown in FIG. 5D, the first metal is allowed to diffuse into a portion of the high-k film 13 that is formed over the first active region 10a, and the second metal is allowed to diffuse into a portion of the high-k film 13 that is formed over the second active region 10b. As a result, the effective work function of the N-type MISFET can be controlled to be lower than that of the P-type MISFET, thereby decreasing the threshold voltage of the N-type MISFET and that of the P-type MISFET.

In addition, in the method for manufacturing a semiconductor device of the present embodiment, since a TiN layer thinner than that of the first embodiment is formed as the first conductive film 48a in the N-type MISFET, and a TiN layer thicker than that of the first embodiment is formed as the TiN layer, which includes the lower conductive film 45b and the second conductive film 48b, in the P-type MISFET, the threshold voltage of the N-type MISFET and that of the P-type MISFET can be made even lower than those of the first embodiment.

Moreover, in the method for manufacturing a semiconductor device of the present embodiment, the first material film 14 is formed, after selectively removing the lower conductive film 45 and the second material film 17, in the first active region 10a (FIG. 5C). Therefore, in the first active region 10a, even if film-thinning and damage occur to the high-k film 13 when selectively removing the lower conductive film 45 and the second material film 17, the first material film 14 can be formed so as to cancel out the influence of the film-thinning and damage to the high-k film 13. Therefore, the first gate insulating film 13a having a high reliability can be formed on the first active region 10a.

In summary, with the semiconductor device of the present embodiment and a method for manufacturing the same, the threshold voltage of the N-type MISFET and that of the P-type MISFET can be decreased, and it is possible to manufacture a semiconductor device without leaving a residual of the gate electrode material on the upper surface of the device isolation region 11, which has been a cause of a defect in conventional semiconductor devices.

Other Embodiments

While the lower conductive film 15a of the first gate electrode 30a is a TaN film in the first embodiment, it may be a TiN film, a tantalum carbide (TaC) film, or the like. While the first conductive film 18a of the first gate electrode 30a and the second conductive film 18b of the second gate electrode 30b are each a TiN film in the first embodiment, they may each be a ruthenium (Ru) film or an aluminum nitride-molybdenum (MoAlN) film.

While the lower conductive film 45b of the second gate electrode 50b is a TiN film in the second embodiment, it may be a TaC film, or the like. While the first conductive film 48a of the first gate electrode 50a and the second conductive film 48b of the second gate electrode 50b are each a TiN film in the second embodiment, they may each be a ruthenium (Ru) film or an aluminum nitride-molybdenum (MoAlN) film.

The first and second embodiments may be modified as follows.

While the first gate insulating film 13a includes a first base film between the first active region 10a and the first high-k film in the embodiments above, the first base film may be absent. While the second gate insulating film 13b includes a second base film between the second active region 10b and the second high-k film in the embodiments above, the second base film may be absent.

While the first and second silicon films 19a and 19b are each made of polysilicon in the embodiments above, they may each be an amorphous silicon film.

In the method for manufacturing a semiconductor device of the first and second embodiments, a heat treatment step for activating the impurity is performed when forming the n-type extension region 21a, the p-type extension region 21b, the n-type source/drain region 25a and the p-type source/drain region 25b, and when forming the silicide layer 26. In these heat treatment steps, the first metal can be allowed to diffuse from the first material film 14 into a portion of the high-k film 13 that is formed over the first active region 10a, and the second metal can be allowed to diffuse from the second material film 17 into a portion of the high-k film 13 that is formed over the second active region 10b. Therefore, instead of separately performing the step of FIG. 2D, the first metal may be allowed to diffuse from the first material film 14 into a portion of the high-k film 13 that is formed over the first active region 10a and the second metal may be allowed to diffuse from the second material film 17 into a portion of the high-k film 13 that is formed over the second active region 10b in the heat treatment step for activating the impurity.

While an $La_2O_3$ film is used as the first material film 14, a film of an oxide of a lanthanoid element other than La, Sc, Sr, Mg, or the like, may be used. Moreover, the first material film 14 may be any film containing, or made of, a metal, e.g., a lanthanoid element such as La, Sc, Sr or Mg. The first material film 14 may not have an insulative property, as long as an insulative property is exhibited when the first metal or a metal compound of the first material film 14 is diffused into the high-k film 13.

While an $Al_2O_3$ film is used as the second material film 17, a $Ta_2O_3$ film may be used. The second material film 17 may be any film containing Al or Ta, and may be a film made of Al or a film made of Ta. The second material film 17 may not have an insulative property, as long as an insulative property is exhibited when the second metal or a metal compound of the second material film 17 is diffused into the high-k film 13.

What is claimed is:

1. A semiconductor device comprising:
a first transistor of a first conductivity type; and
a second transistor of a second conductivity type, wherein
the first transistor includes
   a first gate insulating film formed on a first active region of a semiconductor region and containing a high-k material and a first metal, and
   a first gate electrode including a lower conductive film formed on the first gate insulating film, a first conductive film formed on the lower conductive film, and a first silicon film formed on the first conductive film,
the second transistor includes
   a second gate insulating film formed on a second active region of the semiconductor region and containing the high-k material and a second metal, and
   a second gate electrode including a second conductive film formed on and in contact with the second gate insulating film and made of the same material as the first conductive film, and a second silicon film formed on the second conductive film.

2. The semiconductor device of claim 1, wherein
the first gate insulating film does not contain the second metal, and
the second gate insulating film does not contain the first metal.

3. The semiconductor device of claim 1, wherein
a value of an effective work function of the first transistor is altered by the first metal, and
a value of an effective work function of the second transistor is altered by the second metal.

4. The semiconductor device of claim 1, wherein
a thickness of the first gate electrode is greater than that of the second gate electrode.

5. The semiconductor device of claim 1, wherein
the lower conductive film contains a conductive material and the second metal.

6. The semiconductor device of claim 5, wherein
the conductive material is tantalum nitride, titanium nitride, or tantalum carbide.

7. The semiconductor device of claim 1, wherein
the first conductive film and the second conductive film are each made of titanium nitride, ruthenium or aluminum nitride-molybdenum.

8. The semiconductor device of claim 1, wherein
the first transistor is an N-type MIS transistor, and
the second transistor is a P-type MIS transistor.

9. The semiconductor device of claim 8, wherein
the first metal is at least one of a lanthanoid element, scandium, strontium and magnesium, and
the second metal is at least one of aluminum and tantalum.

10. The semiconductor device of claim 8, wherein
the first metal is lanthanum, and
the second metal is aluminum.

11. The semiconductor device of claim 1, wherein
the first transistor is a P-type MIS transistor, and
the second transistor is an N-type MIS transistor.

12. The semiconductor device of claim 11, wherein
the first metal is at least one of aluminum and tantalum, and
the second metal is at least one of a lanthanoid element, scandium, strontium and magnesium.

13. The semiconductor device of claim 11, wherein
the first metal is aluminum, and
the second metal is lanthanum.

14. The semiconductor device of claim 1, wherein
the high-k material is an oxide, an oxynitride or a silicate containing at least one of hafnium, zirconium and yttrium.

15. The semiconductor device of claim 1, wherein
the first gate insulating film includes a first base film made of a silicon oxynitride between the first active region and the high-k material in the first gate insulating film, and
the second gate insulating film includes a second base film made of the silicon oxynitride between the second active region and the high-k material in the second gate insulating film.

16. The semiconductor device of claim 1, wherein
the first metal is different from the second metal.

17. The semiconductor device of claim 1, wherein
the lower conductive film and the first conductive film do not contain the second metal.

18. The semiconductor device of claim 1, wherein
the lower conductive film contains the first metal.

19. The semiconductor device of claim 1, wherein
the lower conductive film contains a conductive material including tantalum nitride, titanium nitride, or tantalum carbide.

20. The semiconductor device of claim 1, wherein
the lower conductive film contains a conductive material made of tantalum nitride, and
the first conductive film and the second conductive film are each made of titanium nitride.

21. The semiconductor device of claim 1, wherein
the lower conductive film contains a conductive material made of titanium nitride, and
the first conductive film and the second conductive film are each made of titanium nitride.

* * * * *